(12) United States Patent
Kelley et al.

(10) Patent No.: US 8,125,774 B2
(45) Date of Patent: Feb. 28, 2012

(54) PORTABLE KEEPSAKE STORAGE DEVICE WITH A PIVOTING SLEEVE AND USB FLASH DRIVE

(75) Inventors: Roy Blake Kelley, Sanford, FL (US); Toni Lynne Noel, Denver, CO (US)

(73) Assignee: Share Memories, LLC, Denver, CO (US)

( * ) Notice: Subject to any disclaimer, the term of this patent is extended or adjusted under 35 U.S.C. 154(b) by 148 days.

(21) Appl. No.: 12/815,064

(22) Filed: Jun. 14, 2010

(65) Prior Publication Data

US 2011/0304971 A1   Dec. 15, 2011

(51) Int. Cl.
*G06F 1/16* (2006.01)
(52) U.S. Cl. .......... 361/679.31; 439/694; 710/303; 235/457
(58) Field of Classification Search ........... 439/607.34, 439/13, 449, 131, 660, 680, 135, 173, 694; 710/8, 63, 11, 303; 361/679.31, 679.03, 361/679.41, 679.48, 679.29, 679.06, 679.55, 361/679.34; 235/492, 462.09, 375, 454, 235/487, 457; 345/156, 168, 174, 175
See application file for complete search history.

(56) References Cited

U.S. PATENT DOCUMENTS

| | | | |
|---|---|---|---|
| 1,890,664 A | 12/1932 | Alden | |
| 2,255,650 A | 9/1941 | Burke | |
| 4,171,662 A | 10/1979 | Simone et al. | |
| 4,542,631 A | 9/1985 | Esser, III | |
| 5,173,479 A | 12/1992 | Tajima et al. | |
| 5,178,479 A | 1/1993 | Brown et al. | |
| 5,846,039 A | 12/1998 | Kirchen et al. | |
| 7,308,741 B1 | 12/2007 | Rydberg et al. | |
| 7,632,113 B2 | 12/2009 | Finn | |
| 7,824,186 B2 * | 11/2010 | Zhao et al. | 439/13 |
| 7,828,599 B2 * | 11/2010 | Zhao et al. | 439/607.34 |
| 2005/0005409 A1 | 1/2005 | Elnatan | |
| 2006/0075343 A1 | 4/2006 | Henry | |
| 2006/0194612 A1 | 8/2006 | Chen | |
| 2007/0080077 A1 | 4/2007 | Thormahlen | |
| 2008/0213437 A1 | 9/2008 | Leonhardt | |
| 2008/0280490 A1 | 11/2008 | Nguyen et al. | |
| 2008/0289230 A1 | 11/2008 | Mandelbaum et al. | |
| 2008/0291744 A1 | 11/2008 | Hasvold | |
| 2009/0030729 A1 | 1/2009 | Doyle | |
| 2009/0144456 A1 * | 6/2009 | Gelf et al. | 710/8 |
| 2009/0151392 A1 | 6/2009 | Fossas | |
| 2009/0261181 A1 | 10/2009 | Cheung | |
| 2010/0029167 A1 | 2/2010 | Leung | |
| 2010/0044272 A1 | 2/2010 | Shanahan, Sr. et al. | |

* cited by examiner

*Primary Examiner* — Hung Duong
(74) *Attorney, Agent, or Firm* — Dorr, Carson & Birney, P.C.

(57) ABSTRACT

A portable keepsake storage device has a housing with an interior chamber for storing a keepsake, and a USB data storage device held by a pivoting sleeve attached to the housing. The sleeve and USB data storage device can be pivoted between a closed position in which the USB data storage device is concealed in an opening in the housing, and an open position in which the USB connector of the USB data storage device can be plugged into a host system. The USB data storage device can also be held in sliding engagement by the sleeve, so that it can slide between a retracted position and an extended position.

19 Claims, 14 Drawing Sheets

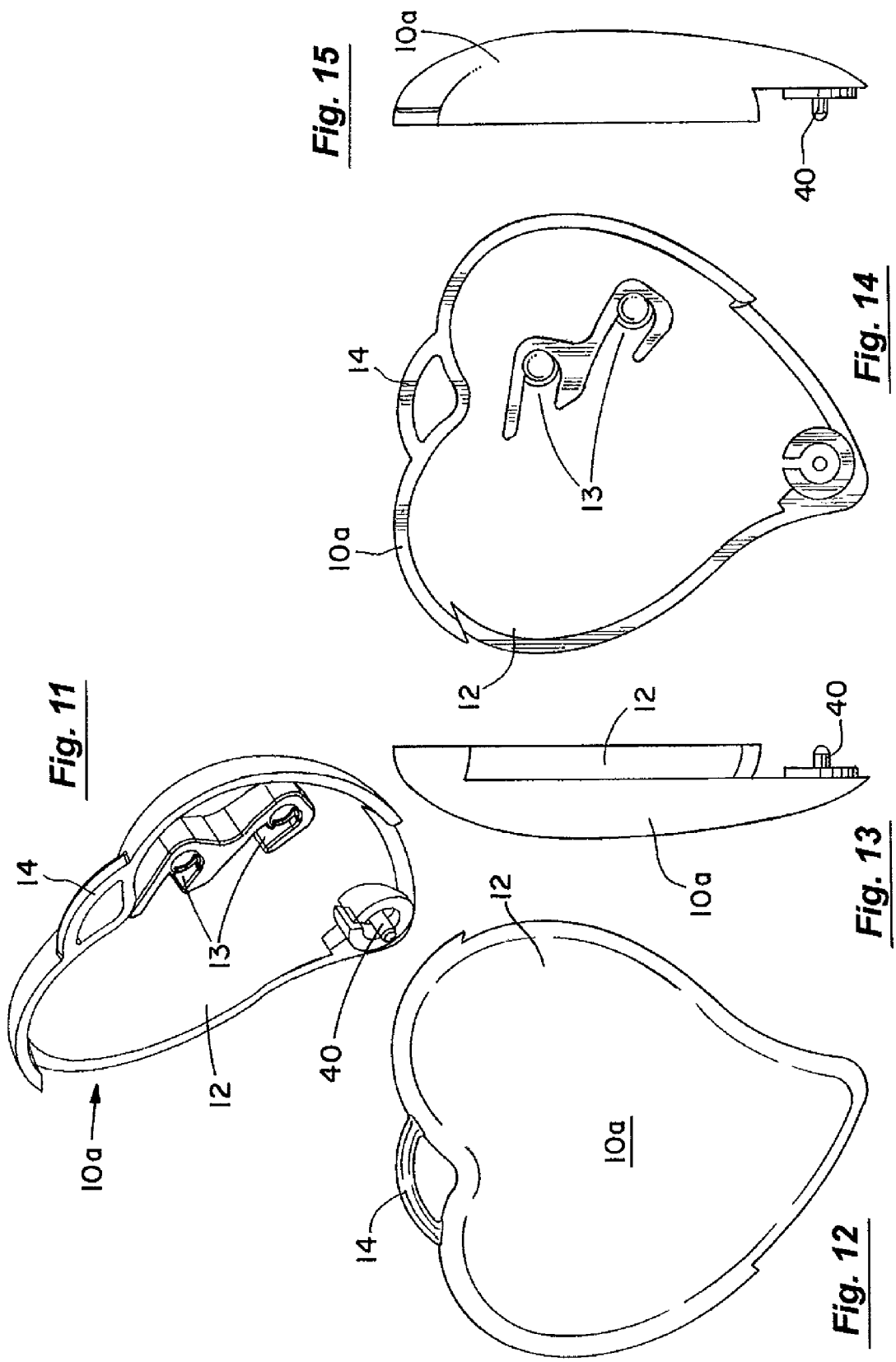

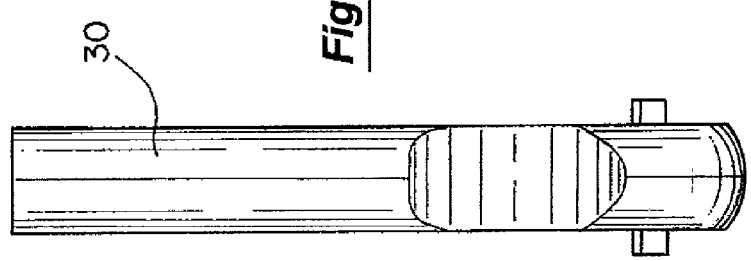
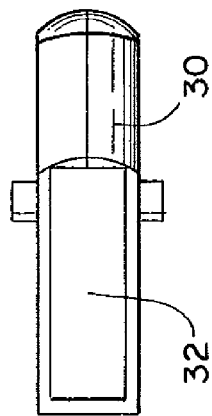
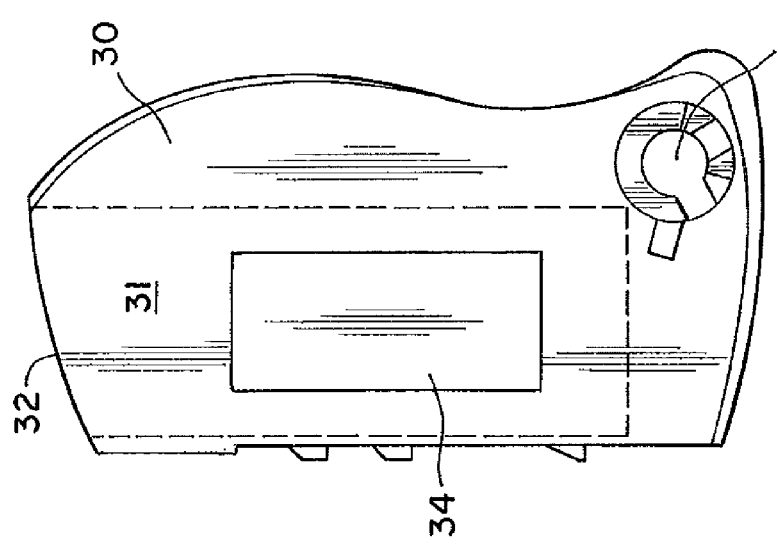
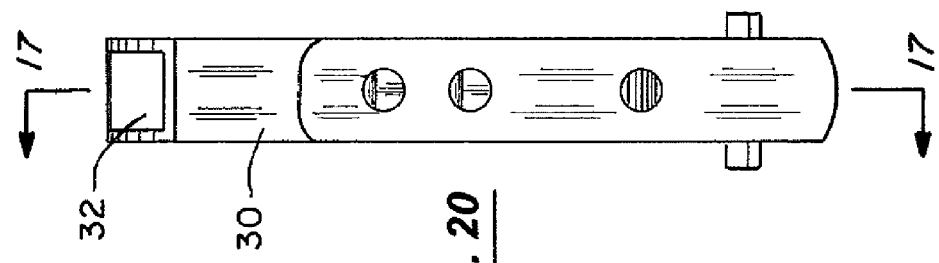

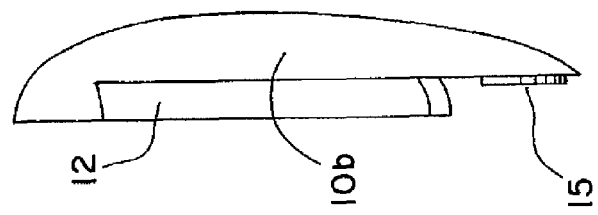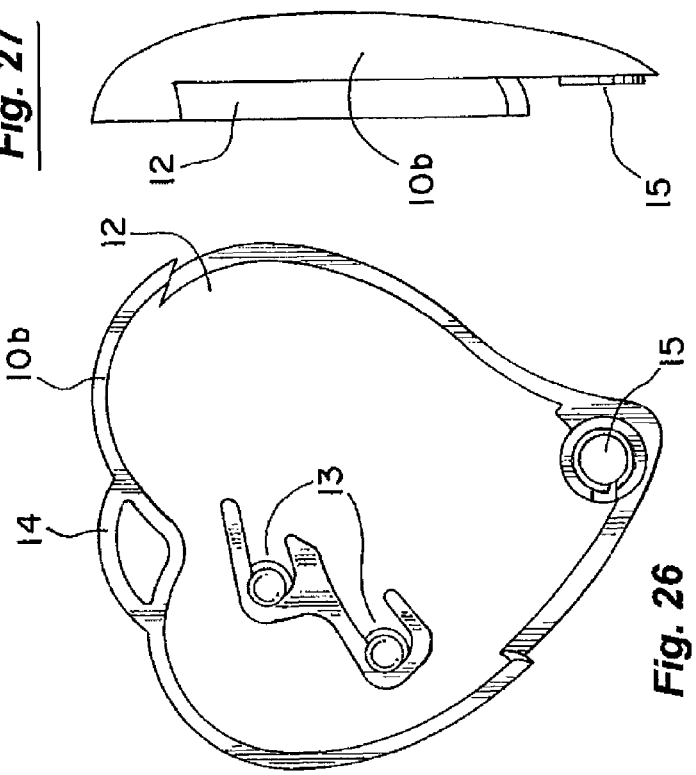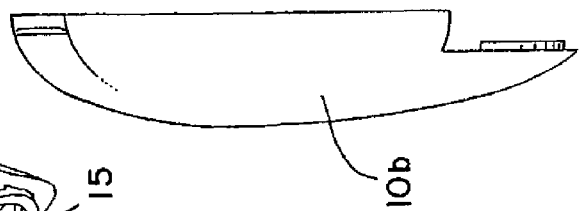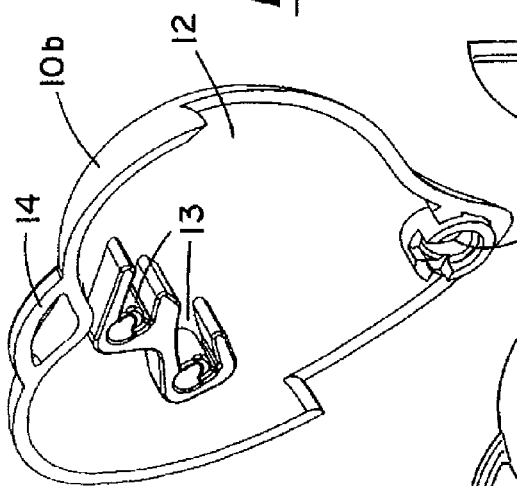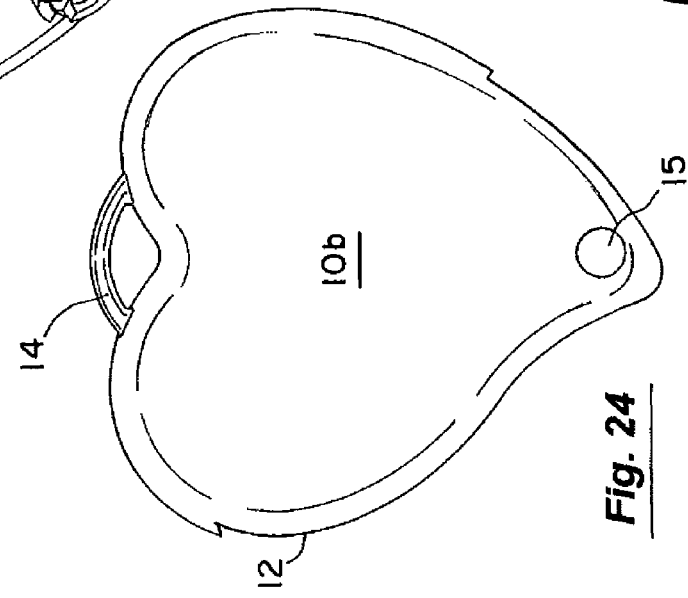

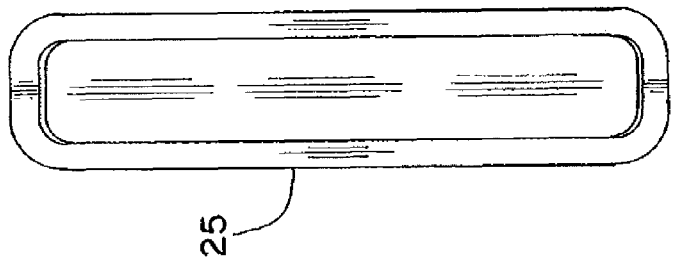
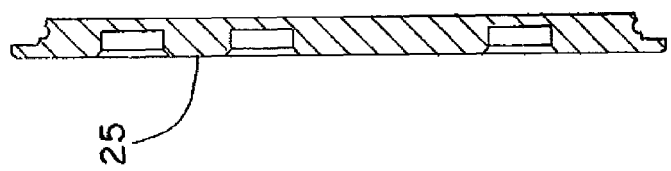
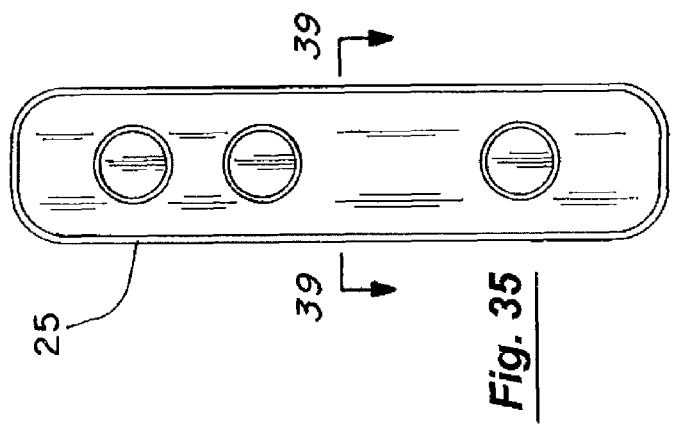
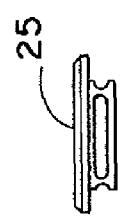
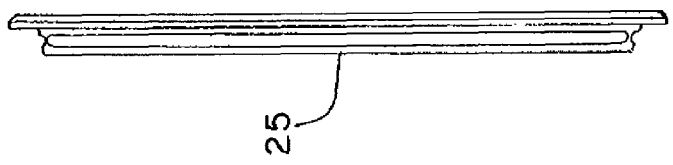
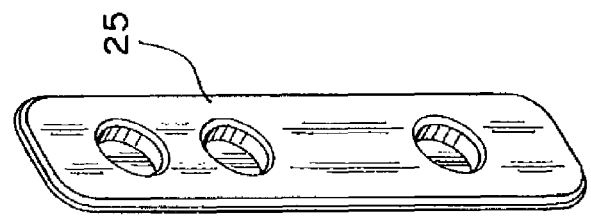

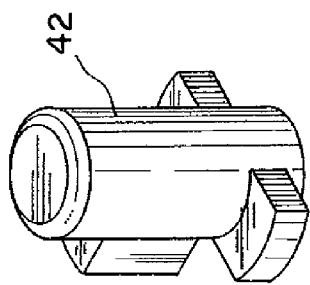
*Fig. 40*
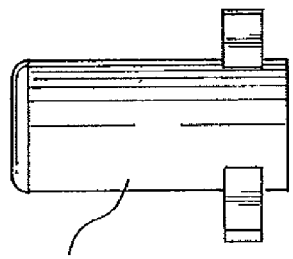
*Fig. 46*  *Fig. 42*
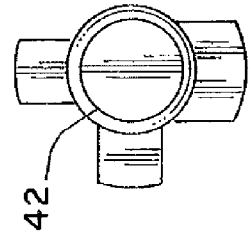
*Fig. 41*
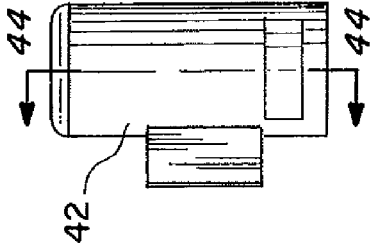
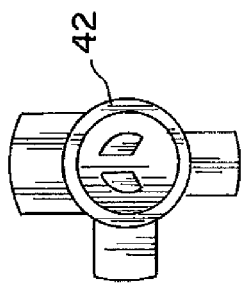
*Fig. 45*
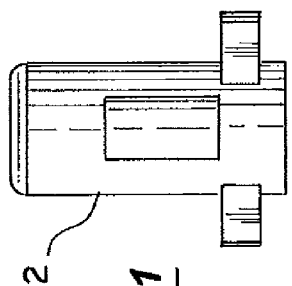
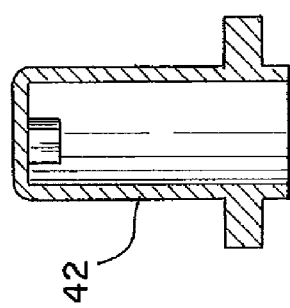
*Fig. 43*
*Fig. 44*

PORTABLE KEEPSAKE STORAGE DEVICE WITH A PIVOTING SLEEVE AND USB FLASH DRIVE

BACKGROUND OF THE INVENTION

Field of the Invention

The present invention relates generally to the field of portable keepsake storage devices, such as pendants. More specifically, the present invention discloses a portable keepsake storage device that incorporates a pivoting sleeve for holding a USB flash drive.

Statement of the Problem

Portable keepsake storage devices have been known for many years. For example, these include a wide variety of pendants, lockets, commemorative plaques, and small keepsake boxes having a housing with a sealable internal chamber that can be used to hold cremation remains, a lock of hair, dried flowers, a small photograph, a memento, or the like associated with a loved one. It should be understood that the loved one could be either a person or a pet. For the purpose of this disclosure, the term "keepsake" should be interpreted broadly to include all such items suitable for storage in a small compartment.

The prior art in the field of USB flash drives is also quite extensive. USB flash drives are commercially available from many manufacturers in a variety of shapes and configurations. One typical type of USB flash drive has a substantially columnar, elongated housing containing flash memory chips for storing digital data and a universal serial bus (USB) controller for interfacing with a host system. A male USB connector is mounted on the end of the housing and enables the USB flash drive to be plugged into a corresponding USB port on a computer or other host electronic device. Data can then be stored to and retrieved from the USB flash drive by the host system.

Data storage devices in general, and USB flash drives in particular, have been used for many years to store data relating to loved ones in the form of photographs, videos, sound recordings, DNA information, genealogical or pedigree information, medical information, pet registration information or the like. The prior art in this field includes tombstones, funerary urns and other types of memorials that incorporate a data storage device and a video display to play recorded videos or photographs of a loved one.

Returning to the discussion of portable keepsake storage devices, the aesthetic appearance of such devices must be a balanced with functional requirements. In particular, many keepsake storage devices are essentially jewelry, and as such, require the maintenance of high aesthetic standards to be acceptable to potential purchasers. In contrast, many conventional USB flash drives maintain high standards in terms of industrial design and technical specifications as data storage devices, but are not usually considered to be jewelry. Thus, a need exists for a portable keepsake storage device that maintains the high aesthetic standard for a keepsake storage device, while incorporating the functionality of a USB flash drive.

Solution to the Problem

The present invention addresses this concern by providing a portable keepsake storage device having a pivoting sleeve holding a USB flash drive. The sleeve and USB flash drive can be pivoted between a closed position in which they are stored in an opening in the housing of the device, and an open position in which the USB connector of the USB flash drive can plug into a host system. In addition, the cover for the interior keepsake chamber of the device can be concealed within this opening when the sleeve is in its closed position. The result is a keepsake storage device that combines the functionality of a USB flash drive with the high aesthetic standards of a keepsake storage device. In particular, the USB flash drive and its USB connector are concealed when retracted into the sleeve, and the all of these components are largely concealed within the device housing when the sleeve is pivoted to its closed position.

SUMMARY OF THE INVENTION

This invention provides a portable keepsake storage device having a housing with an interior chamber for storing a keepsake, and a USB data storage device held by a pivoting sleeve attached to the housing. The sleeve and USB data storage device can be pivoted between a closed position in which the USB data storage device is concealed in an opening in the housing, and an open position in which the USB connector of the USB data storage device can be plugged into a host system. The USB data storage device can also be held in sliding engagement by the sleeve, so that it can slide between a retracted position and an extended position.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which:

FIG. 11 is a perspective view of the front half 10a of the pendant housing.

FIG. 12 is a front view of the front half 10a of the pendant housing.

FIG. 13 is a right side view of the front half 10a of the pendant housing.

FIG. 14 is a rear view of the front half 10a of the pendant housing.

FIG. 15 is a left side view of the front half 10a of the pendant housing.

FIG. 19 is a front view of the sleeve 30.

FIG. 20 is a left side view of the sleeve 30.

FIG. 21 is a right side view of the sleeve 30.

FIG. 22 is a top view of the sleeve 30.

FIG. 23 is a perspective view of the rear half 10b of the pendant housing.

FIG. 24 is a rear view of the rear half 10b of the pendant housing.

FIG. 25 is a left side view of the rear half 10b of the pendant housing.

FIG. 26 is a front view of the rear half 10b of the pendant housing.

FIG. 27 is a right side view of the rear half 10b of the pendant housing.

FIG. 33 is a perspective view of the cover 25 for the keepsake chamber.

FIG. 34 is a left side view of the cover 25

FIG. 35 is a front view of the cover 25

FIG. 36 is a cross-sectional view of the cover 25.

FIG. 37 is a rear view of the cover 25.

FIG. 38 is a bottom view of the cover 25.

FIG. 39 is another cross-sectional view of the cover 25 orthogonal to FIG. 36.

FIG. 40 is a perspective view of the latch pin 42.

FIG. 41 is a left side view of the latch pin 42.

FIG. 42 is a front view of the latch pin 42.

FIG. 43 is a right side view of the latch pin 42.

FIG. 44 is a cross-sectional view of the latch pin 42.

FIG. 45 is a bottom view of the latch pin 42.

FIG. 46 is a top view of the latch pin 42.

DETAILED DESCRIPTION OF THE INVENTION

Figure 10:
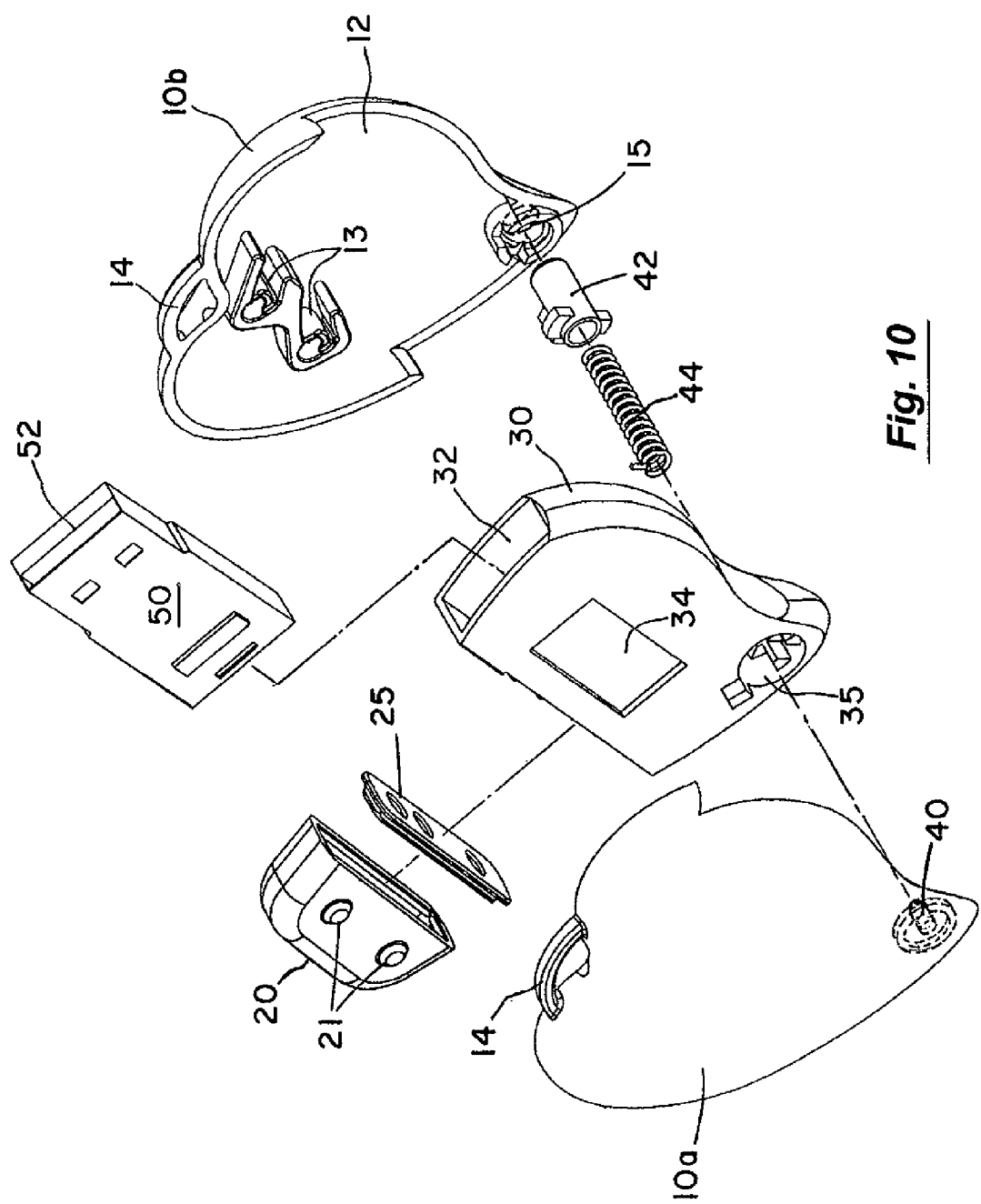
FIG. 10 is an exploded perspective view corresponding to FIG. 1.
Figure 18:
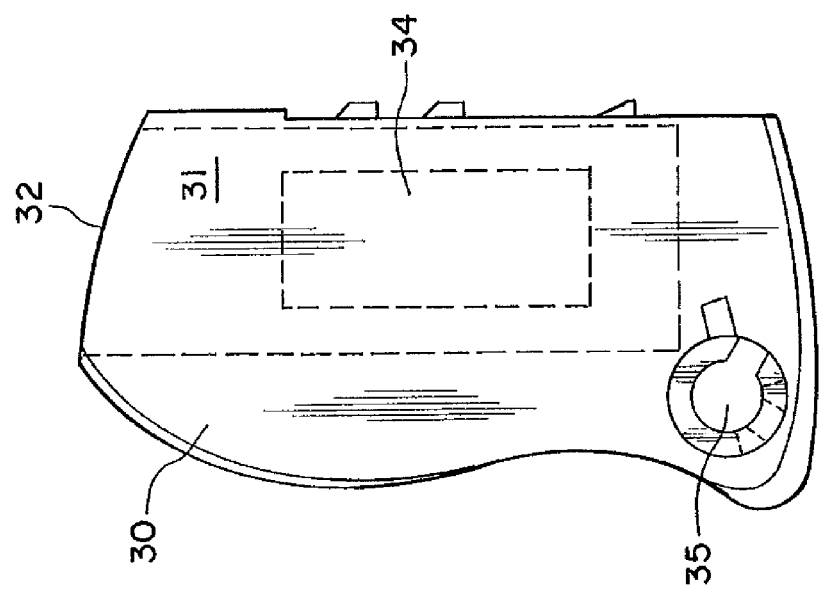
FIG. 18 is a rear view of the sleeve 30.

The present invention has a small housing 10 enclosing an interior keepsake chamber 20 for containing a keepsake (e.g., cremation remains 60, a lock of hair, a memento or other small personal objects). For example, the housing 10 can be configured as a pendant suitable for use on a necklace or bracelet. If the housing 10 is intended for use as a pendant, it can include a loop 14 for attachment as a pendant to a necklace, bracelet, etc. FIG. 10 is an exploded perspective view illustrating all of the components. The housing 10 could also be configured as other types of jewelry, or as a plaque, commemorative display, money clip or key ring.

Figure 1:
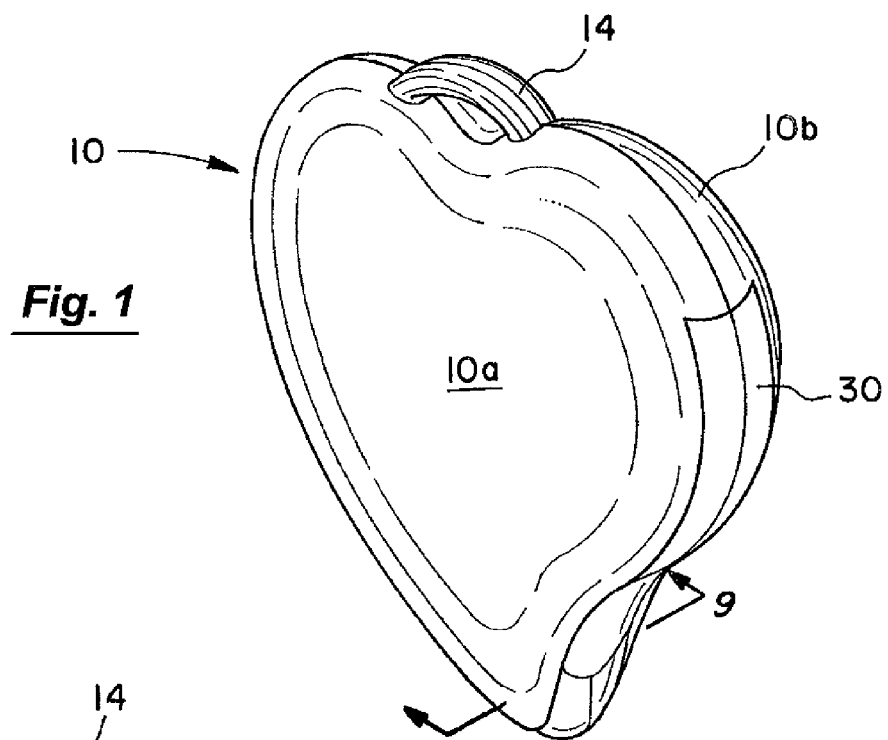
FIG. 1 is a perspective view of an embodiment of the present invention with the pivoting sleeve 30 in the closed position.
Figure 2:
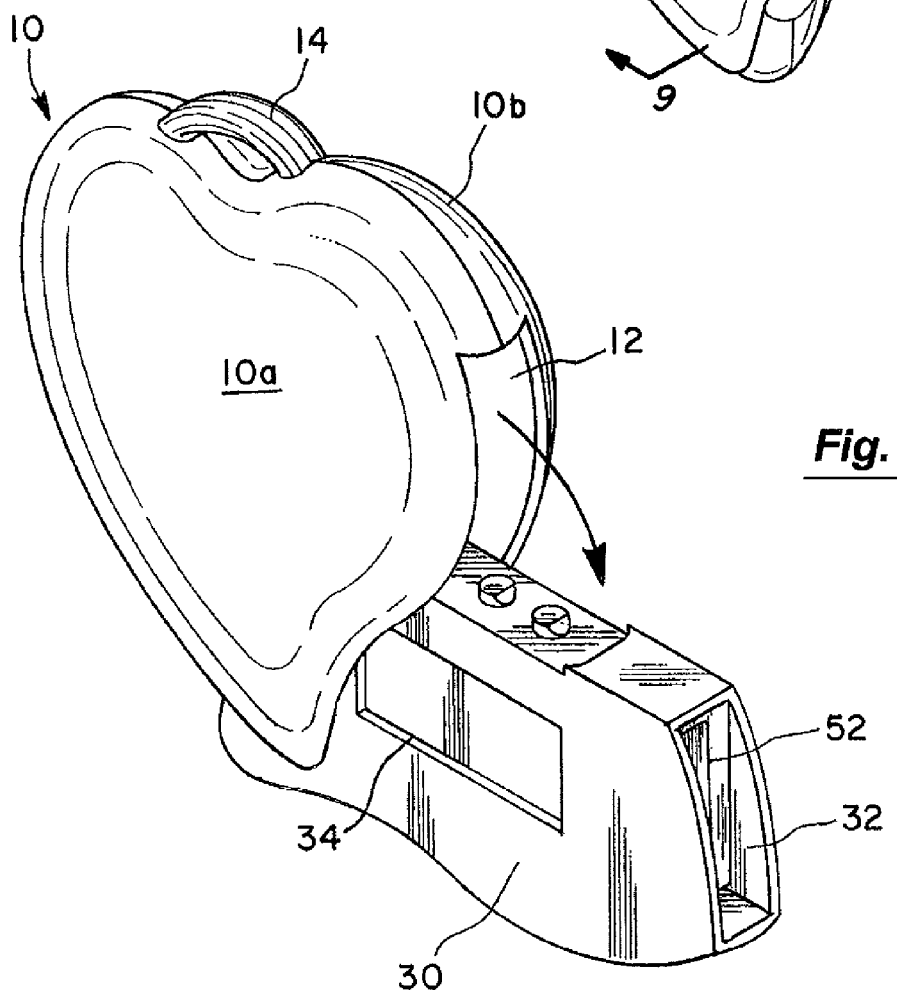
FIG. 2 is a perspective view corresponding to FIG. 1 with the pivoting sleeve 30 in the open position.
Figure 4:
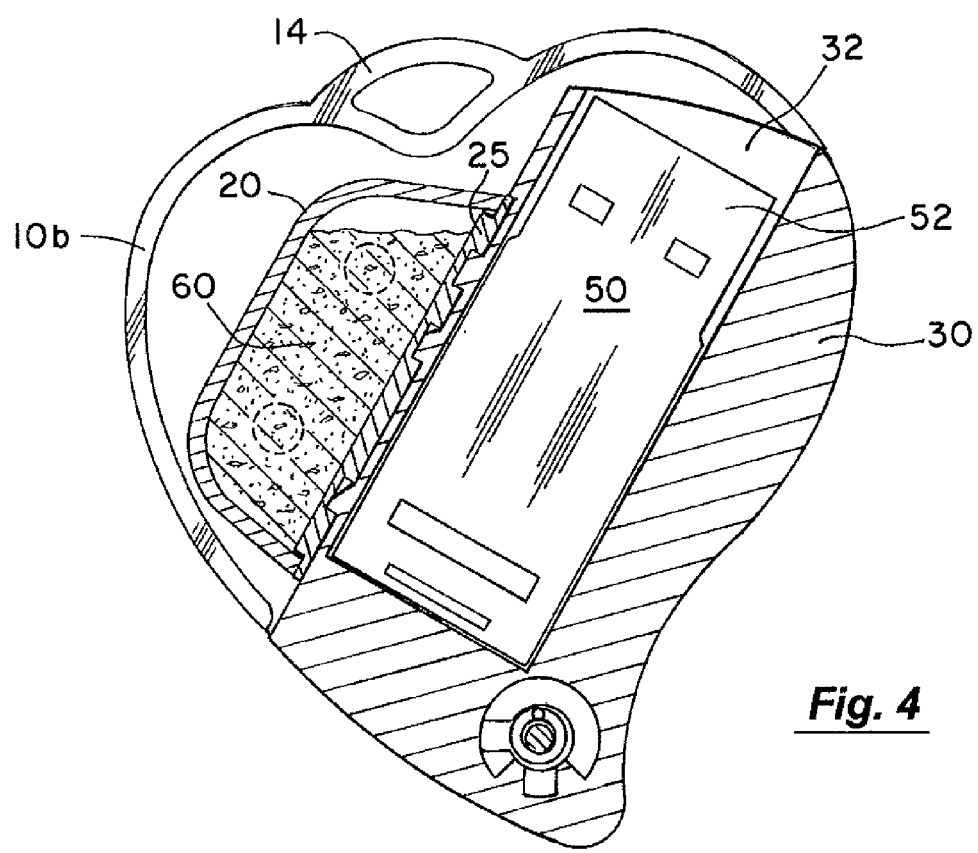
FIG. 4 is a cross-sectional view of the keepsake storage device corresponding to FIG. 1.
Figure 16:
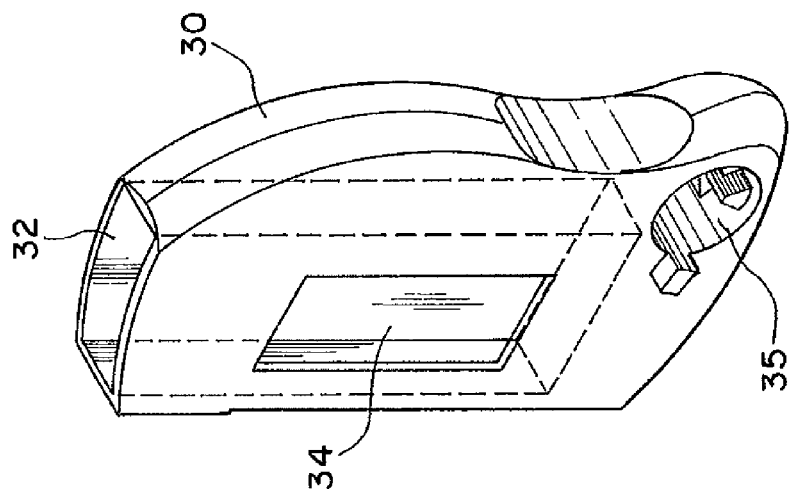
FIG. 16 is a perspective view of the pivoting sleeve 30.
Figures 28, 29:
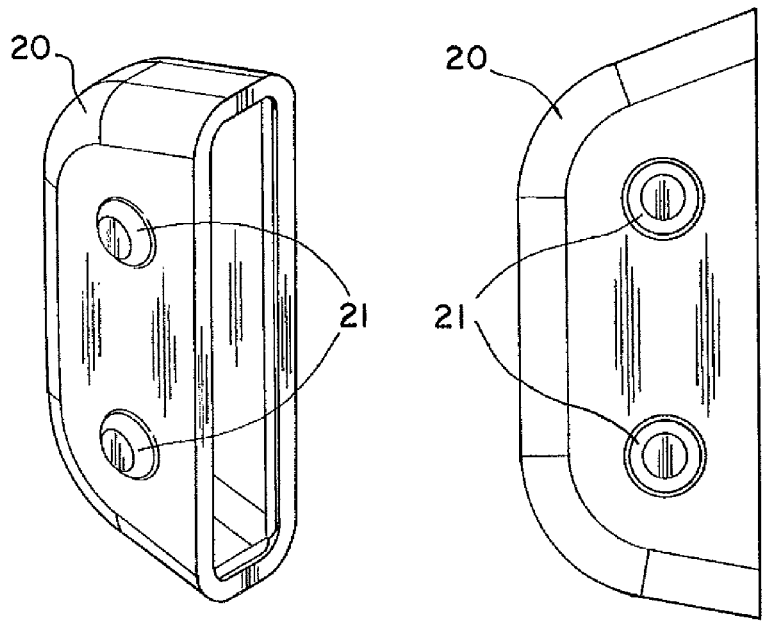
FIG. 28 is a perspective view of the keepsake chamber 20.
FIG. 29 is a left side view of the keepsake chamber 20.
Figures 30, 31, 32:
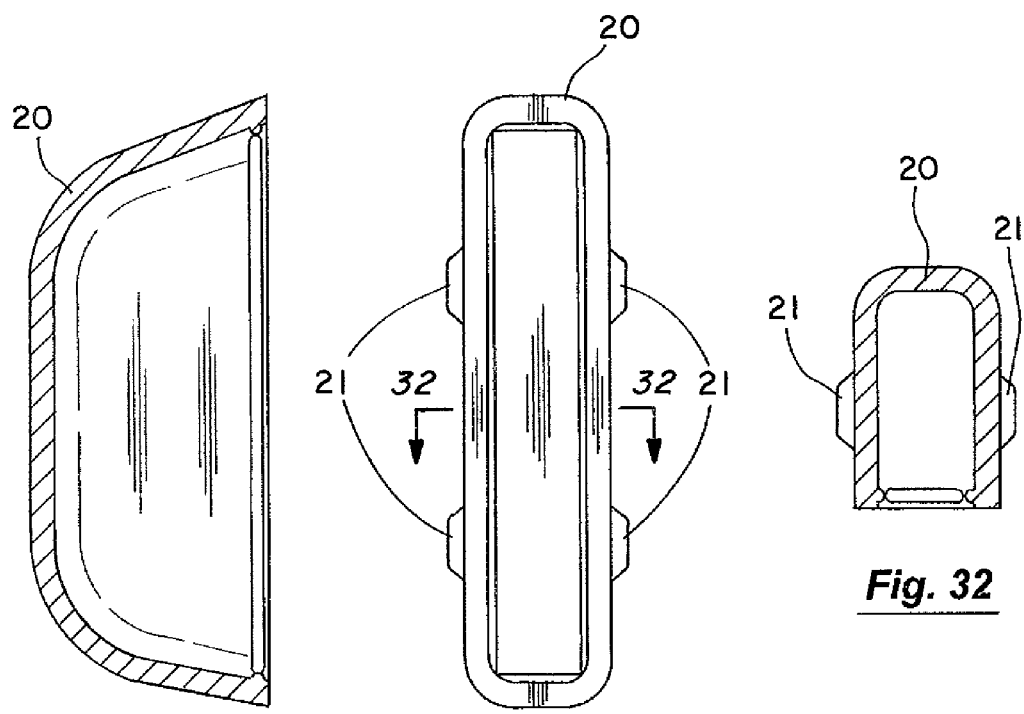
FIG. 30 is a cross-sectional view of the keepsake chamber 20.
FIG. 31 is a top view of the keepsake chamber 20.
FIG. 32 is another cross-sectional view of the keepsake chamber 20 with its cover 25 attached.

A sleeve 30 holding a USB data storage device 50 is pivotably attached to the housing 10 by a hinge or pivot mechanism. The sleeve 30 and USB flash drive 50 can be pivoted between a closed position in which the USB flash drive 50 is concealed, and an open position in which the USB connector 52 of the USB flash drive 50 can be plugged into a host system. FIG. 1 is a perspective view of the present invention with the sleeve 30 in its closed position. FIG. 2 is a perspective view with the pivoting sleeve 30 in the open position. A corresponding cross-sectional view is shown in FIG. 4. FIG. 16 is a perspective view of the sleeve 30. FIGS. 18-22 are corresponding rear, front, left side, right side, and top views, respectively, of the sleeve 30.

Figure 9:
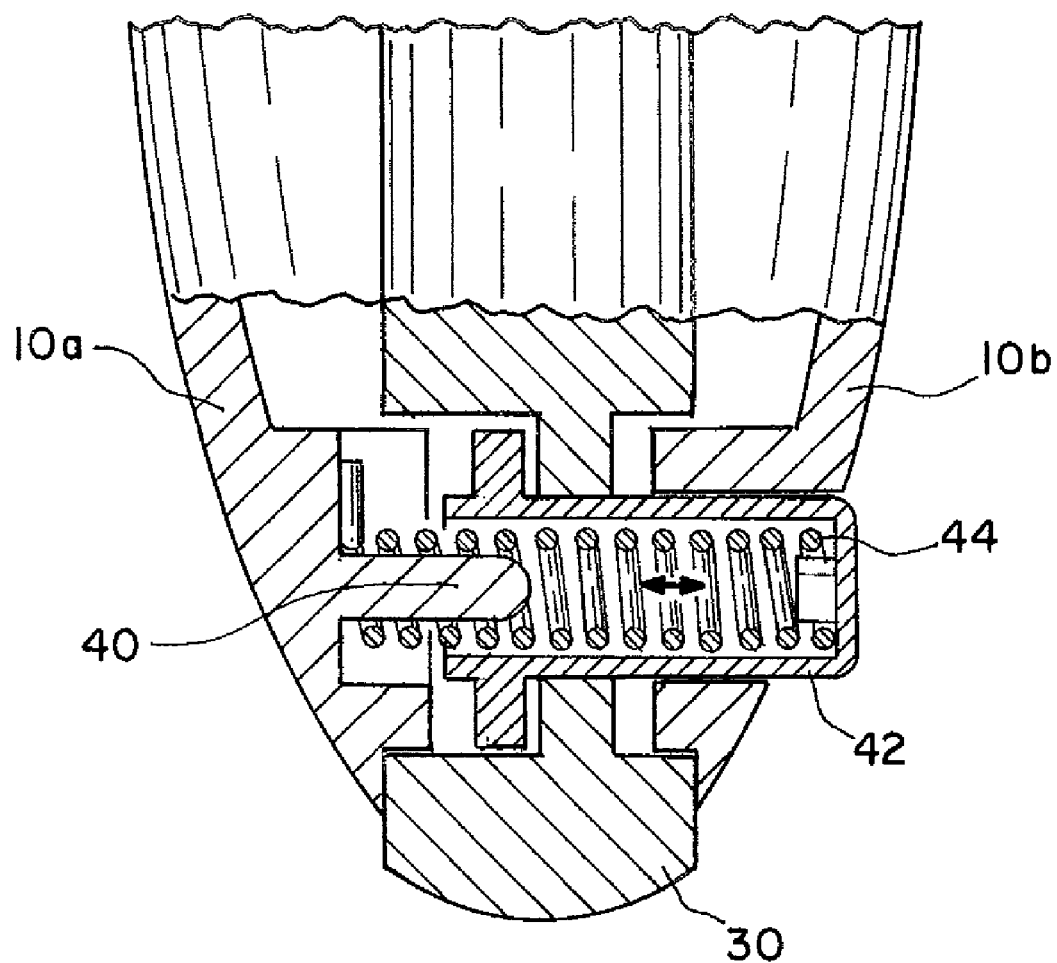
FIG. 9 is a cross-sectional view of the hinge assembly for the pivoting sleeve 30.

FIG. 9 is a cross-sectional view of the hinge mechanism for the pivoting sleeve 30. A latch pin 42 loaded by a spring 44 controls actuation of the hinge mechanism to release the sleeve 30 from its closed position and allow it to pivot to its open position. FIGS. 40-46 show additional views of the latch pin 42. The spring 44 and the hollow base of the latch pin 42 are seated on a hinge pin 40 extending rearward from the front half 10a of the housing 10. The body of the latch pin 42 extends through a hole 35 in the sleeve 30 and a hole 15 in the rear half 10b of the housing 10. Protrusions extending outward from the cylindrical wall of the latch pin 42 engage corresponding surfaces associated with the holes 35, 15 through the sleeve 30 and the housing 10 to prevent the sleeve from pivoting out of its closed position (shown in FIG. 1) unless the exposed head of the latch pin 42 has been depressed. When the latch pin 42 is depressed, these protrusions on the latch pin 42 move out of engagement with the sleeve 30 and housing 10, and allow the sleeve 30 to freely pivot about the latch pin 42 to the open position shown in FIG. 2.

In the embodiment shown in the accompanying drawings, the sleeve 30 pivots laterally outward from the opening 12 in the housing 10 in its open position, and is largely concealed behind the front surface of the housing 10 in its closed position. It should be noted that the keepsake chamber 20 is concealed by the sleeve 30 in its closed position. It should also be understood that other shapes and configurations of the pendant housing 10 and sleeve 30 could be readily substituted. In addition, the pivot mechanism for the sleeve 30 could be placed in any of a number of possible locations with respect to the pendant housing 10 to allow the sleeve 30 to pivot in any desired direction.

Figure 3:
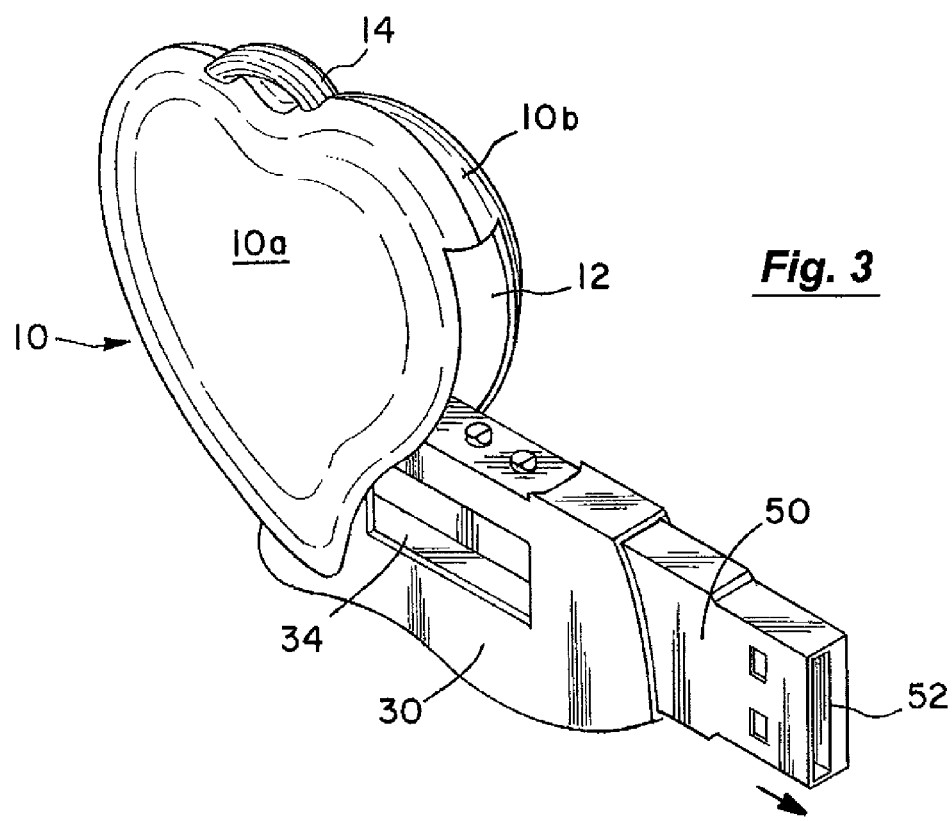
FIG. 3 is a perspective view corresponding to FIGS. 1 and 2 with the pivoting sleeve 30 in the open position and the USB flash drive 40 extended from the pivoting sleeve 30.
Figure 5:
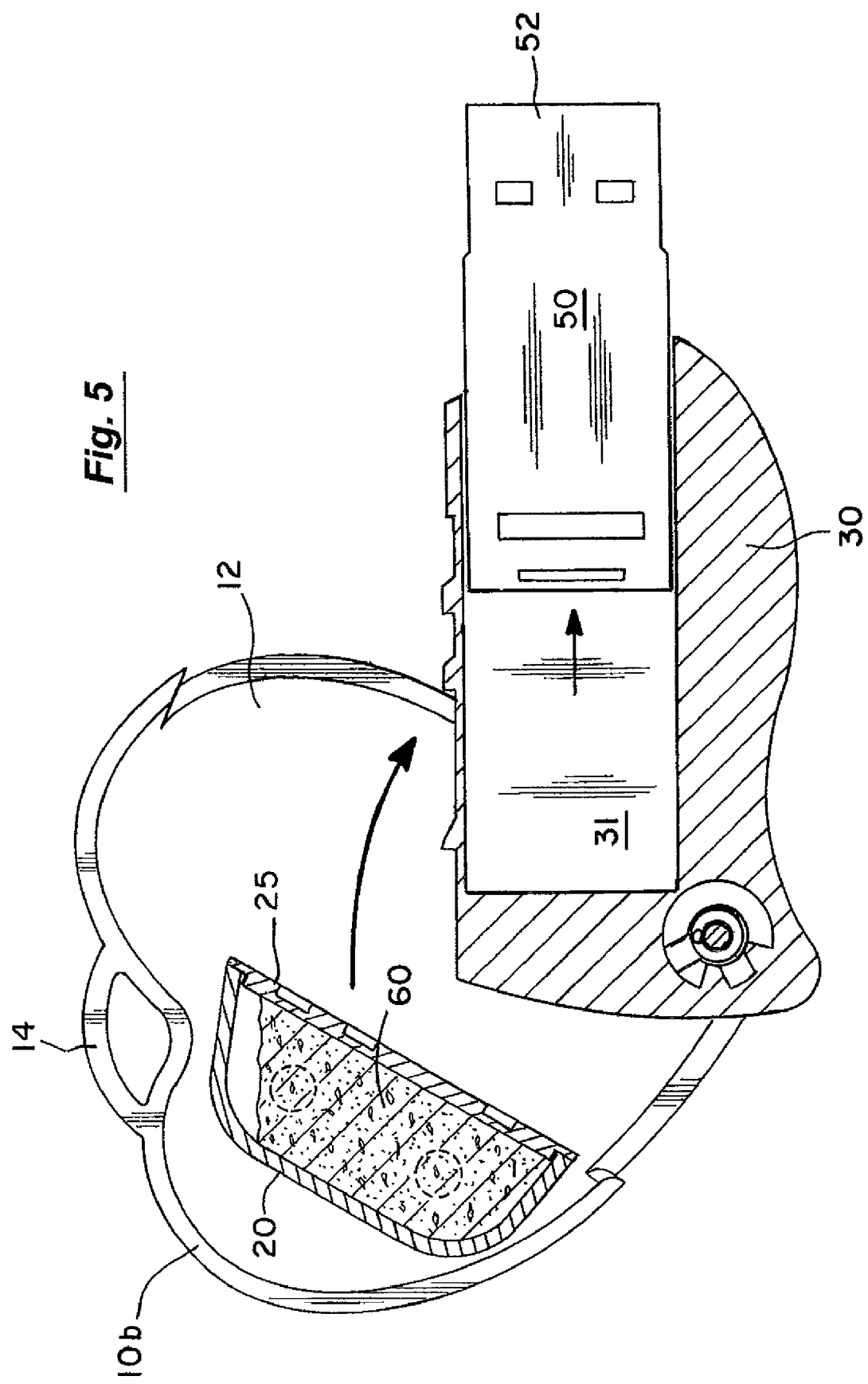
FIG. 5 is a cross-sectional view of the keepsake storage device corresponding to FIG. 3.
Figure 17:
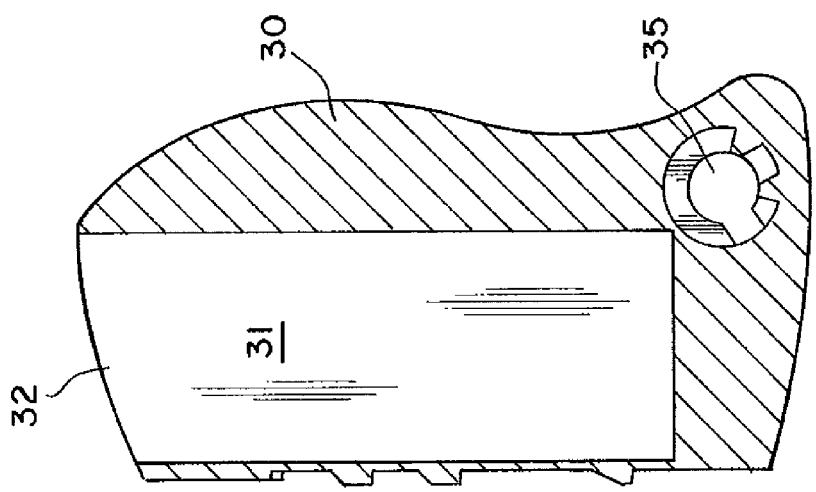
FIG. 17 is a cross-sectional view of the sleeve 30.

In the preferred embodiment of the present invention, the pivoting sleeve 30 includes a passageway 31 or slot with a cross-sectional shape and dimensions suitable to holding a USB flash drive 50 in sliding engagement with the sleeve 30. FIG. 17 is a cross-sectional view of the sleeve 30 showing this passageway 31. During initial assembly, a USB flash drive 50 having a substantially columnar profile is inserted into the passageway 31 of the sleeve 30 via the end opening 32 of the sleeve 30. In use, the USB flash drive 50 can slide within the sleeve 30 between a retracted position in which the USB flash drive 50 and its USB connector 52 are completely contained within the sleeve 30 (shown in FIG. 2), and an extended position in which the USB connector 52 extends beyond the end opening 32 of the sleeve 30 so that the USB flash drive 50 can be plugged into a host system. FIG. 3 is a perspective view with the pivoting sleeve 30 in the open position and the USB flash drive 50 extended. FIG. 5 is a corresponding cross-sectional view.

The sleeve 30 can be equipped with a window 34 through one of the side walls of the sleeve 30 into its interior passageway 31. This enables a user to manually slide the USB flash drive 50 between its retracted and extended positions. For example, this can be done by pressing the user's thumb or finger through the window 34 against the exposed surface of the USB flash drive 50 within the sleeve 30.

It should be understood that there are a number of ways to effectively conceal the sleeve 30 in its closed position to enhance the overall aesthetics of the pendant. The embodiment depicted in the drawings has an opening 12 along an edge of the of the pendant housing 10 behind the front surface of the housing 10. The pivoting sleeve 30 occupies this opening 12 in its closed position, and therefore is largely hidden when the pendant is viewed from the front. However, this opening 12 could be omitted. For example, the pivoting sleeve 30 could be formed as a complementary portion of the pendant housing 10. In other words, the portion of the pendant housing 10 containing the keepsake chamber 20 and the sleeve 30 containing the USB flash drive 50 could be formed as complementary portions of a pendant connected by a hinge.

The previous disclosure and the accompanying drawings have employed a conventional USB flash drive 50 as the data storage device for the present invention. USB flash drives have the advantages of being commercially available at modest cost, and of being usable with virtually any type of personal computer and with many other types of computers, video systems, personal electronic devices and other host systems. In addition, many USB flash drives have a generally columnar shape, which makes them especially well-suited for sliding engagement with the sleeve 30 in the present device. It should be understood that any type of USB data storage device could be readily substituted, as well as other types of compact, modular data storage devices in current use or that may hereafter be developed. For example, data storage devices with other types of communications protocols and connectors (e.g., Firewire) could also be used. All such alternative devices should be considered a "USB data storage devices" for the purposes of this disclosure.

Figure 6:
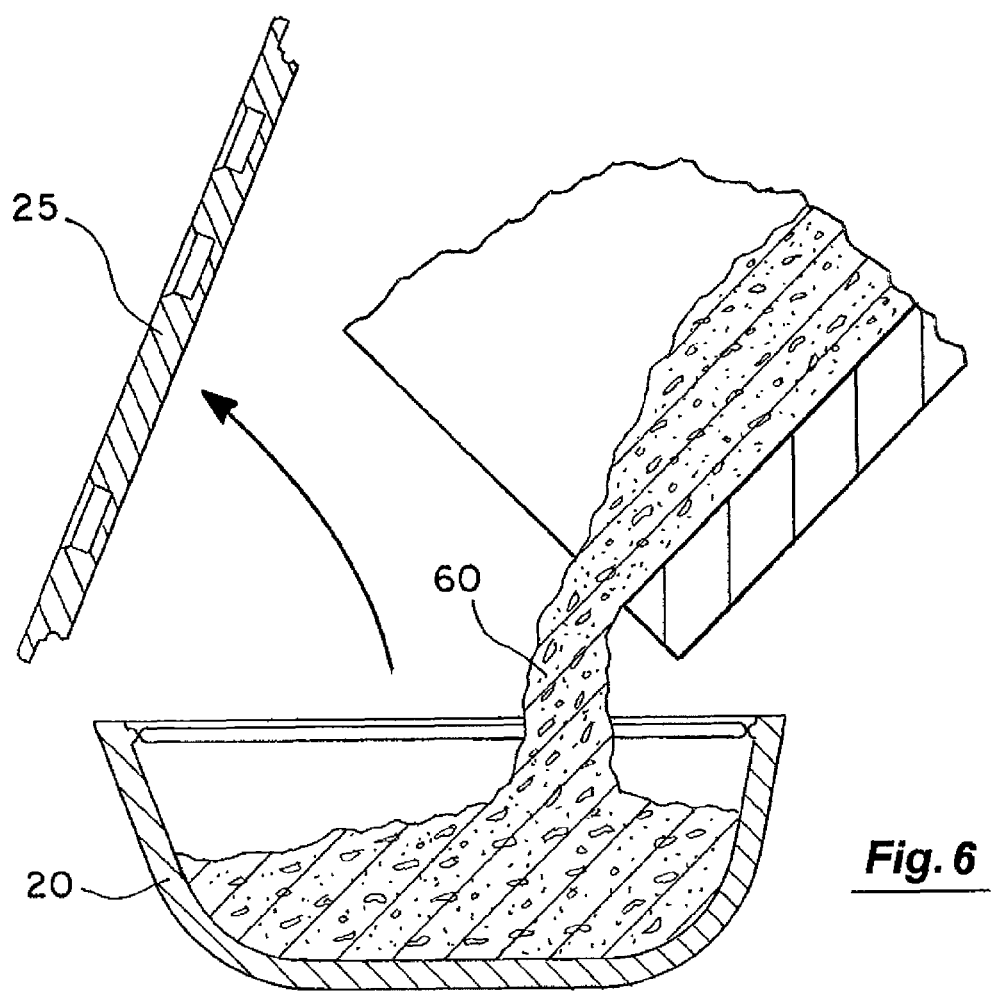
FIG. 6 is a cross-sectional view of the keepsake chamber 20 with its cover 25 removed and being filled with cremation remains 60.
Figure 7:
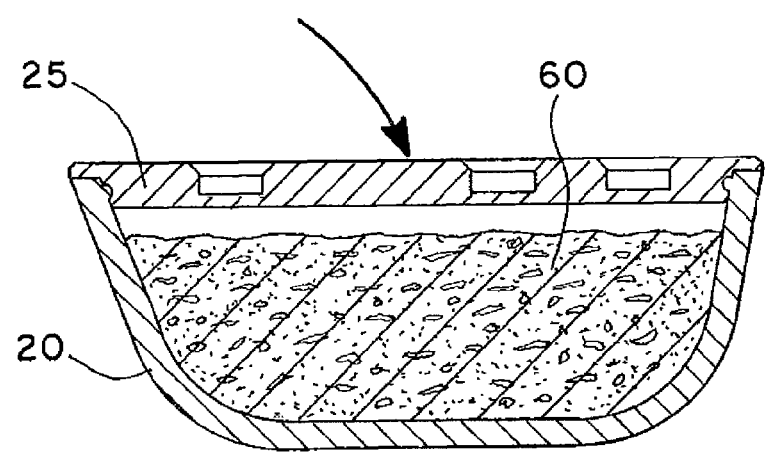
FIG. 7 is a cross-sectional view of the keepsake chamber 20 after filling and after the cover 25 has been attached.

The keepsake chamber 20 in the embodiment shown in the accompanying drawings is a separate chamber that is inserted into the pendant housing 10 after a keepsake has been placed into the chamber 20. The keepsake chamber 20 can be equipped with a cover 25 to close or seal the chamber 20. For example, FIG. 6 is a cross-sectional view of the keepsake chamber 20 with the cover 25 removed and being filled with cremation remains 60. FIG. 7 is a cross-sectional view of the keepsake chamber 20 after filling and after the cover 25 has been attached.

Figure 8:
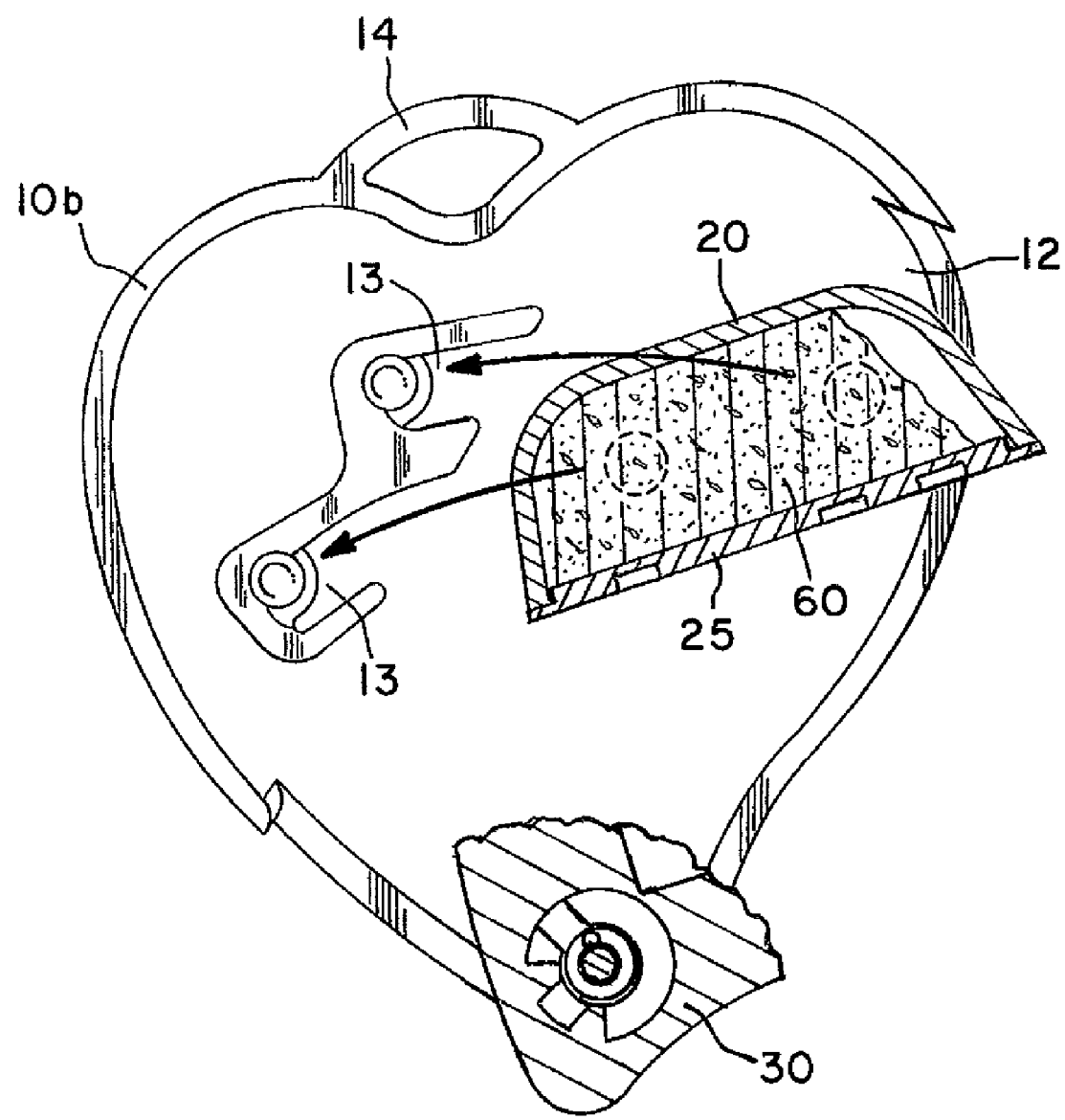
FIG. 8 is a cross-sectional view of the pendant housing 10 of the keepsake storage device showing insertion of the keepsake chamber 20 into the tracks 13 on the interior of the pendant housing 10.

FIG. 8 is a cross-sectional view of the pendant housing 10 showing insertion of the keepsake chamber 20 into tracks 13 on the interior of the pendant housing 10. Small protrusions 21 on the exterior side walls of the keepsake chamber 20 slidably engage these tracks 13 on the housing 10 to guide and secure the keepsake chamber 20 into place. FIGS. 28-32 depict additional views of the keepsake chamber 20. FIGS. 33-39 provide additional views of the cover 25. FIGS. 11-15 show additional views of the front half 10a of the housing 10 and FIGS. 23-27 show additional views of the rear half 10b of the housing 10, including the tracks 13 for engaging the keepsake chamber 20.

As previously discussed, the keepsake chamber 20 is initially filled with a keepsake (e.g., cremation remains 60) and its cover 25 is secured to seal the keepsake chamber 20. In the specific embodiment shown in the accompanying drawings, the sleeve 30 is then pivoted to its open position (shown in FIG. 2) and the keepsake chamber 20 is attached to small buttons or tabs on the medial face of the sleeve 30 that engage corresponding detents in the cover 25 of the keepsake chamber 20, as shown in FIG. 4. The assembly of the sleeve 30 and keepsake chamber 20 can then be rotated to the closed position of the sleeve 30. As this occurs, the sleeve 30 guides the keepsake chamber 20 within the housing 10, so that the protrusions 21 on the sides of the keepsake chamber 20 properly engage and slide along the tracks 13 on the inside of the housing 10. As the sleeve 30 reaches its fully closed position, the protrusions 21 on the sides of the keepsake chamber 20 reach complementary recesses at the ends of the tracks 13 on the housing that securely engage these protrusions 21 to firmly secure the keepsake chamber 20 in place within the housing 10. This can include a snap-fit or other tactile feedback to advise the user that the keepsake chamber 20 has been secured within the housing 10. The sleeve 30 can be subsequently reopened to access the USB flash drive 50 and closed without disturbing the keepsake chamber 20. Alternatively, the keepsake chamber 20 could be permanently built into the housing 10 or formed as part of the housing 10.

The above disclosure sets forth a number of embodiments of the present invention described in detail with respect to the accompanying drawings. Those skilled in this art will appreciate that various changes, modifications, other structural arrangements, and other embodiments could be practiced under the teachings of the present invention without departing from the scope of this invention as set forth in the following claims.

We claim:

1. A portable keepsake storage device comprising:
a housing with an interior chamber for storing a keepsake;
a USB data storage device having a USB connector; and
a sleeve holding the USB data storage device and pivotably attached to the housing, said sleeve and USB data storage device pivoting between a closed position in which the USB data storage device is concealed and an open position in which the USB connector of the USB data storage device can be plugged into a host system.

2. The device of claim 1 further comprising a cover for closing the keepsake chamber.

3. The device of claim 2 wherein the cover of the keepsake chamber is concealed by the sleeve in its closed position.

4. The device of claim 1 wherein the housing further comprises an opening occupied by the sleeve in its closed position.

5. The device of claim 4 wherein the housing comprises a front surface, and wherein the opening is concealed behind the front surface of the housing.

6. The device of claim 4 wherein the sleeve pivots laterally outward from the opening in the housing to the open position.

7. The device of claim 1 wherein the USB data storage device is held in sliding engagement by the sleeve, and slides between a retracted position and an extended position in which the USB connector can be plugged into a host system.

8. The device of claim 7 wherein the sleeve further comprises a window for manually sliding the USB data storage device between the retracted and extended positions.

9. A portable keepsake storage device comprising:
a housing with an interior chamber for storing a keepsake;
a USB data storage device having a USB connector; and
a sleeve pivotably attached to the housing to pivot between a closed position and an open position; said sleeve holding the USB data storage device in sliding engagement to slide between a retracted position and an extended position in which the USB connector of the USB data storage device can be plugged into a host system while the sleeve is pivoted to the open position.

10. The device of claim 9 further comprising a cover for closing the keepsake chamber.

11. The device of claim 10 wherein the cover of the keepsake chamber is concealed by the sleeve in its closed position.

12. The device of claim 9 wherein the housing further comprises an opening occupied by the sleeve in its closed position.

13. The device of claim 12 wherein the sleeve pivots laterally outward from the opening in the housing to its open position.

14. The device of claim 9 wherein the sleeve further comprises a window for manually sliding the USB data storage device between the retracted and extended positions.

15. A portable keepsake storage device comprising:
- a housing having a front surface, an interior chamber for storing a keepsake, and an opening along an edge behind the front surface;
- a USB data storage device having a USB connector; and
- a sleeve holding the USB data storage device and pivotably attached to the housing; said sleeve and USB data storage device pivoting between a closed position in which the USB data storage device is concealed in the opening in the housing, and an open position in which the sleeve pivots out of the opening so that the USB connector of the USB data storage device can be plugged into a host system.

16. The device of claim 15 wherein the USB data storage device is held in sliding engagement by the sleeve, and slides between a retracted position and an extended position in which the USB connector can be plugged into a host system.

17. The device of claim 16 wherein the sleeve further comprises a window for manually sliding the USB data storage device between the retracted and extended positions.

18. The device of claim 15 further comprising a cover for closing the keepsake chamber.

19. The device of claim 18 wherein the cover of the keepsake chamber is concealed by the sleeve in its closed position.

\* \* \* \* \*